United States Patent
Rhinehart et al.

(10) Patent No.: US 10,506,734 B2
(45) Date of Patent: Dec. 10, 2019

(54) INFORMATION HANDLING SYSTEM HAVING SYNCHRONIZED POWER LOSS DETECTION ARMED STATE

(71) Applicant: DELL PRODUCTS, LP, Round Rock, TX (US)

(72) Inventors: Aaron M. Rhinehart, Georgetown, TX (US); Dan Rao, Austin, TX (US); Binay A. Kuruvila, Cedar Park, TX (US)

(73) Assignee: Dell Products, LP, Round Rock, TX (US)

( * ) Notice: Subject to any disclaimer, the term of this patent is extended or adjusted under 35 U.S.C. 154(b) by 150 days.

(21) Appl. No.: 15/867,176

(22) Filed: Jan. 10, 2018

(65) Prior Publication Data

US 2019/0215980 A1  Jul. 11, 2019

(51) Int. Cl.
| | | |
|---|---|---|
| G06F 1/00 | (2006.01) | |
| G06F 11/30 | (2006.01) | |
| H05K 7/14 | (2006.01) | |
| G06F 1/3206 | (2019.01) | |
| G06F 11/20 | (2006.01) | |

(52) U.S. Cl.
CPC ........ *H05K 7/1492* (2013.01); *G06F 1/3206* (2013.01); *G06F 11/3034* (2013.01); *G06F 11/2015* (2013.01)

(58) Field of Classification Search
None
See application file for complete search history.

(56) References Cited

U.S. PATENT DOCUMENTS

| | | |
|---|---|---|
| 8,289,801 B2 | 10/2012 | Smith et al. |
| 2017/0060697 A1 | 3/2017 | Berke et al. |

*Primary Examiner* — Nitin C Patel
(74) *Attorney, Agent, or Firm* — Larson Newman, LLP

(57) ABSTRACT

An information handling system includes multiple power supply units, and first and second chassis management controllers. The power supply units provide power to components within the information handling system. The first chassis management controller calculates a first number of power supply units needed to provide power to the components of the information handling system, and asserts a first chassis armed signal to servers in response to a detection that the first number of power supply units is greater than zero. The second chassis management controller receives the first number of power supply units from the first chassis management controller, and asserts a second chassis armed signal to the servers in response to a detection that the first number of power supply units being greater than zero.

14 Claims, 5 Drawing Sheets

INFORMATION HANDLING SYSTEM HAVING SYNCHRONIZED POWER LOSS DETECTION ARMED STATE

FIELD OF THE DISCLOSURE

The present disclosure generally relates to information handling systems, and more particularly relates to an information handling system having a synchronized power loss detection armed state.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes multiple power supply units, and first and second chassis management controllers. The power supply units may provide power to components within the information handling system including multiple servers. The first chassis management controller may calculate a minimum power supply units count needed to provide power to the components of the information handling system, may store the minimum power supply units count in first monitor circuitry of the first chassis management controller, and may assert a first chassis armed signal to servers in response the minimum power supply units count being greater than zero. The second chassis management controller may receive the minimum power supply units count from the first chassis management controller, may store the minimum power supply units count in second monitor circuitry of the second chassis management controller, and may assert a second chassis armed signal to the servers in response to the minimum power supply units count being greater than zero. The servers may operate in a persistent memory mode in response to reception of at least one of the first and second chassis armed signals.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
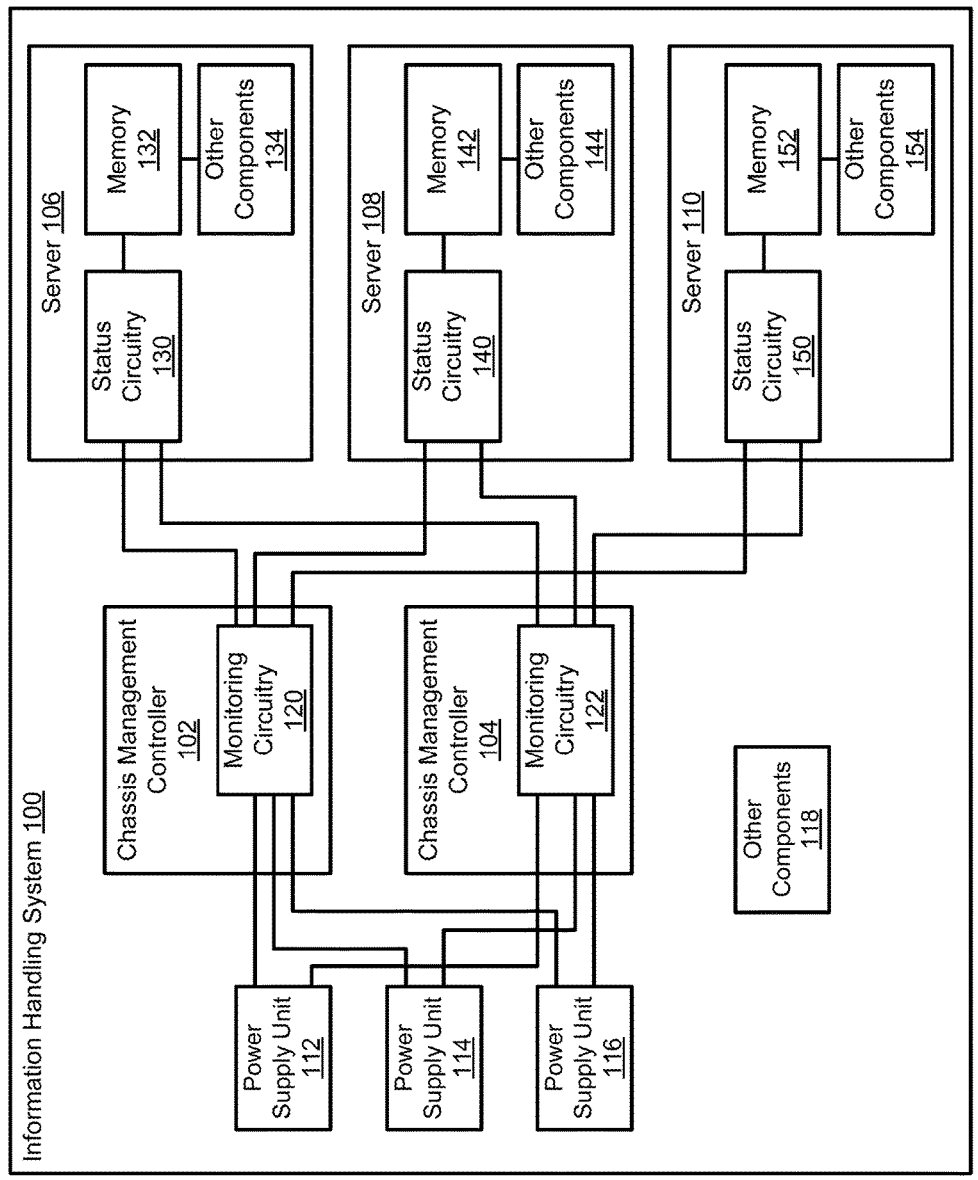
FIG. 1 is a block diagram of an information handling system according to at least one embodiment of the disclosure.

FIG. 1 shows a portion of an information handling system 100, such as a server chassis. For purpose of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch, a router, or another network communication device, or any other suitable device and may vary in size, shape, performance, functionality, and price.

The information handling system 100 includes chassis management controllers 102 and 104, servers 106, 108, and 110, power supply units 112, 114, and 116, and other components 118. The chassis management controllers 102 and 104 include respective monitoring circuitry 120 and 122. The server 106 includes status circuitry 130, a memory 132, and other components 134. The server 108 includes status circuitry 140, a memory 142, and other components 144. The server 110 includes status circuitry 150, a memory 152, and other components 154. In an embodiment, the status circuitries 130, 140, and 150 can by any type of processing device. While the embodiment of the information handling system 100 illustrated in FIG. 1 includes two chassis management controllers, three servers, and three power supply units, the number of these components may change without varying from the scope of this disclosure. For example, the information handling system 100 could include six power supply units and eight servers without varying from the scope of this disclosure.

In an embodiment, the information handling system 100 can be a shared infrastructure modular chassis, such that all the resources within the information handling system 100 are shared by all the components. The power supply units 112, 114, and 116 can be configured in a redundancy power mode, such that each of the power supply units 112, 114, and 116 are connected to and can provide power to all the components within the information handling system 100 including the chassis management controllers 102 and 104, the servers 106, 108, and 110, and the other components 118. In an embodiment, each of the memories 132, 142, and 152 can be a persistent memory, non-persistent memory, or a combination of persistent and non-persistent memory.

In an embodiment, the servers 106, 108, and 110 can include persistent memories, such as memories 132, 142, and 152, and the servers 106, 108, and 110 may require an external notification that a power loss event has occurred so that the servers 106, 108, and 110 can perform a persistent memory save operation. In an embodiment, the servers 106, 108, and 110 do not directly monitor a power supply unit status, nor determine an infrastructure power threshold that can be utilized to determine if a power loss event has occurred. In this embodiment, the servers 106, 108, and 110 can be informed by at least one of the chassis management controllers 102 and 104 that the chassis management controller can detect a power loss event, and the servers 106, 108, and 110 can then be armed for a persistent memory operation.

Thus, the chassis management controllers 102 and 104 may control all monitoring and budgeting aspects of power supply unit power for the information handling system 100. In embodiment, the chassis management controllers 102 and 104 may consist of a higher-level entity which manages power control configuration and policies, as well as a lower-level programmable logic entity, such as the monitoring circuitry 120 and 122 to provide real-time monitoring and execution of control logic. In an embodiment, the combination of chassis management controller 102 and chassis management controller 104 can provide redundancy for a power loss detection armed state within the information handling system 100. This redundancy provides a high level of availability and ensures that in the event of a failure in one of the chassis management controllers 102 and 104, a redundant agent is armed and available to notify the servers 106, 108, and 110 of a power loss event. In an embodiment, one of the chassis management controllers, such as chassis management controller 102, can be the primary or active chassis management controller, and the other chassis management controller, such as chassis management controller 104, can be the secondary or standby chassis management controller.

During operation, the chassis management controller 102, configured as the active controller, can calculate a total number of power supplies needed to keep the information handling system 100 running, MIN_PSU_COUNT. The chassis management controller 102 can make this calculation based on several different factors, such as the peak power requirements of all the components within the information handling system 100, the average power requirements for the components, other infrastructure requirements, user policies, and the like. In an embodiment, a user policy could include configuring one or more of the power supply units 112, 114, and 116 as a redundant power supply unit, such that this or these power supply units cannot be utilized in calculating an amount of available power for the components of the information handling system 100. In an embodiment, the chassis management controller 102 may not allow a component within the information handling system 100 to power on if the component would break a user policy. In an embodiment, the number of power supply units needed, MIN_PSU_COUNT, can be dynamic and can be changed based on a hot-plug device being added to or removed from information handling system 100. Thus, in this embodiment, the chassis management controller 102 can re-calculate the number of power supply units needed, MIN_PSU_COUNT, in response to a configuration change within the information handling system 100.

After the chassis management controller 102 calculates the number of power supply units needed, MIN_PSU_COUNT, the chassis management controller 102 can store this number as a threshold value in monitoring circuitry 120. The chassis management controller 102 can then broadcast a CHASSIS_ARMED signal to the servers 106, 108, and 110, via a low-latency interface, that the monitoring circuitry 120 is currently monitoring the power supply units 112, 114, and 116 to detect whether a power disruption occurs that would cause the information handling system 100 to shut down. In an embodiment, the assertion of the CHASSIS_ARMED signal to the servers 106, 108, and 110 can be in response to a determination that the number of power supply units needed, MIN_PSU_COUNT, is greater than zero.

The chassis management controller 102 can then synchronize the number of power supply units needed, MIN_PSU_COUNT, between the chassis management controllers 102 and 104 to assure that the monitoring circuitry 120 and 122 can both actively running. Each monitoring circuitry 120 and 122 can monitor the power supply units 112, 114, and 116 to detect whether the power loss condition occurs and can independently broadcast to each server 106, 108, and 110 a CHASSIS_ARMED signal to indicate that the information handling system 100 or chassis is armed to detect a power loss. In an embodiment, each of the chassis management controllers 102 and 104 can have access to power requirements of the information handling system 100, and can individually calculate the number of power supply units needed, MIN_PSU_COUNT.

In an embodiment, the status circuitry 130, 140, and 150 can be incorporated within the respective server 106, 108, and 110, can be coupled to the server, or the like. The status circuitry 130, 140, and 150 may be configured to detect when it's respective sever 106, 108, and 110 is powering on, and if the server supports persistent memory that requires early power loss notification. In an embodiment, the early power loss notification can be utilized by the servers 106, 108, and 110 to guarantee the memory remains persistent. During a boot process of each server 106, 108, and 110, the respective status circuitry 130, 140, and 150 can check the CHASSIS_ARMED state communicated by one or more of the monitoring circuitries 120 and 122 via CHASSIS_ARMED signal sent over the low-latency interface. The operation of the status circuitries 130, 140, and 150 can be substantially similar. Therefore, for brevity and clarity the operation will be described with respect to persistent memory 132 and server 106.

If the status circuitry 130 does not receive a CHASSIS_ARMED signal from either of the monitoring circuitries 120 and 122, the status circuitry 130 can synchronize the server 106 to a chassis state, such as a chassis without power loss detection. In an embodiment, the synchronizing of the server 106 to the chassis state can include the server 106 not arming the persistent memory 132, and placing the memory 132 into a read only mode.

Upon receiving one or more CHASSIS_ARMED signals from monitoring circuitries 120 and/or 122, the status circuitry 130 can arm the persistent memory 132 within the server 106 and place the server 106 in a persistent memory mode of operation. The components within the server 106 can then boot to execute an operating system after the persistent memory is armed. If the monitoring circuitry 120 later detects that a power loss event has occurred, the status circuitry 130 can perform a save process to preserve data within the persistent memory 132. In an embodiment, the detection of the power loss event by the status circuitry 130 can come from a signal received from one or both of the monitoring circuitries 120 and 122.

The status circuitry 130 can continue to monitor the low-latency interface for additional signals from the monitoring circuitries 120 and 122, such as a CHASSIS_DISARMED signal indicating that a power loss event can no longer be detected. In an embodiment, the low-latency interface can enable the status circuitry 130 to change the server 106 from operating the memory 132 in a persistent mode to a read only mode in near real-time based on the point-to-point communication between the monitoring circuitries 120 and 122 and the status circuitry 130. In an embodiment, the monitoring circuitries 120 and 122 may no longer be able to detect a power loss event temporarily due to re-initialization of the chassis management controllers 102 and 104, permanently due to hardware and/or system failures within the information handling system 100, or the like. In an embodiment, the CHASSIS_DISARMED signal can also be asserted by the monitoring circuitries 120 and/or 122 in response to a determination that the number of power supply units needed, MIN_PSU_COUNT, is equal to zero. In response to receiving a CHASSIS_DISARMED signal from both of the monitoring circuitries 120 and 122 the status circuitry 130 can provide a signal to a user or administrator of the server 106. In an embodiment, the signal can be a notification of the fault and to inform the administrator to take appropriate actions to preserve data in the persistent memory 132.

While the information handling system 100 has been described with respect to a single chassis with servers 106, 108, and 110 located herein, this disclosure can be implemented with the information handling system 100 as a server rack and the chassis management controllers 102 and 104 can be rack management controllers that communicate with chassis management controllers within different chassis in the server rack without varying from the scope of this disclosure.

Figure 2:
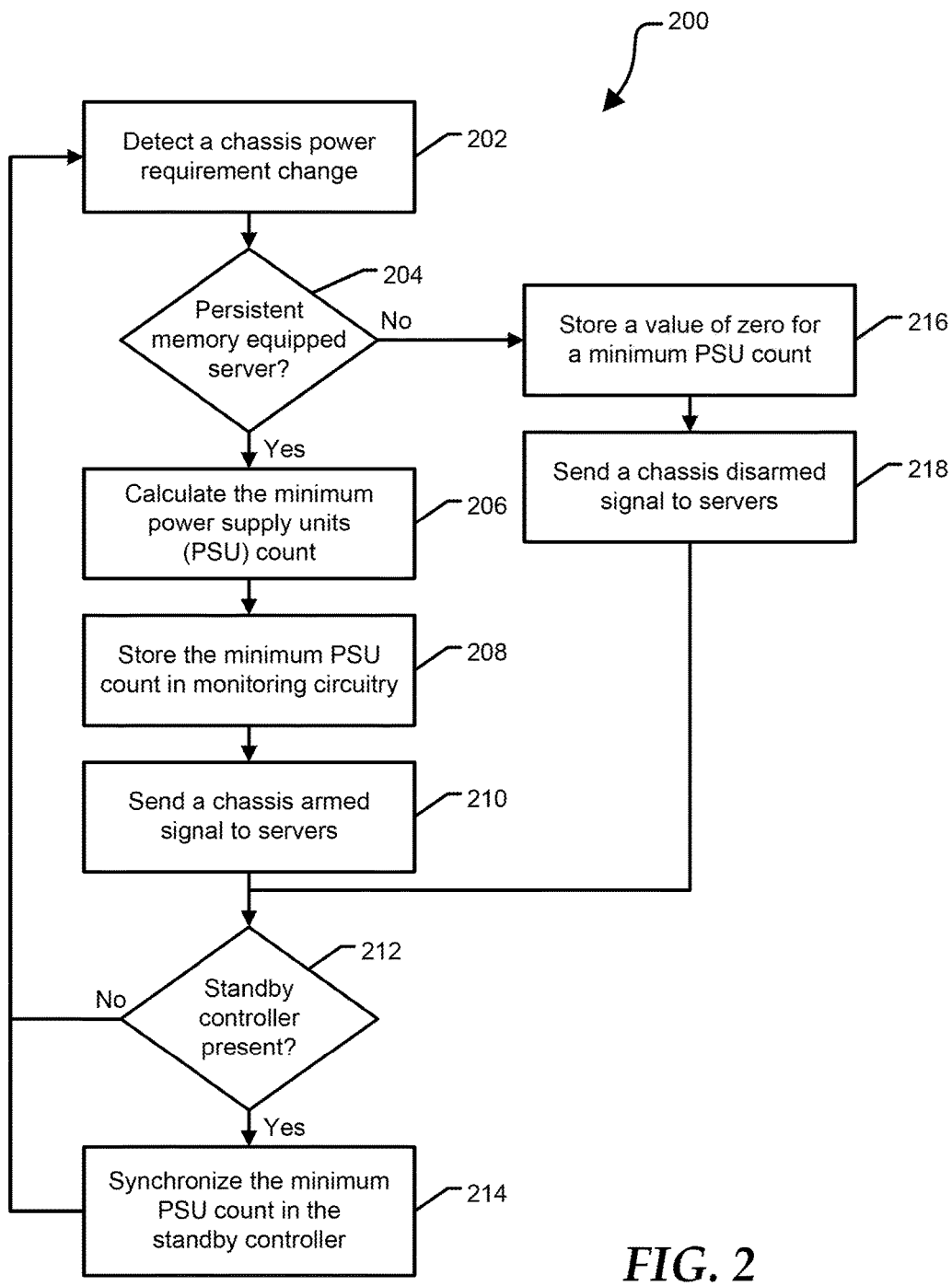
FIG. 2 is a flow diagram of a method for determining, in a primary chassis management controller, whether the information handling system is armed or disarmed to monitor a power loss in the information handling system according to at least one embodiment of the present disclosure.

FIG. 2 illustrates a method 200 of a primary chassis management controller determining whether the information handling system or chassis is armed or disarmed to monitor a power loss in the information handling system according to at least one embodiment of the present disclosure. At block 202, a chassis power requirement change is detected. In an embodiment, the chassis power requirement change can be based on one or more component being added to the information handling system, such as a server, a cooling fan, a chassis management controller, or the like, and a component changing its power state from low power state to a high power state or from the high power state to the low power state, such as turning on or off a server or other chassis component. At block 204, a determination is made whether a persistent memory equipped server is located within the information handling system. If a persistent memory equipped server is located within the information handling system, a minimum number of power supply units, MIN_PSU_COUNT, needed for the information handling system is calculated at block 206. In an embodiment, the minimum number of power supply units, MIN_PSU_COUNT, can be based on several different factors, such as the peak power requirements of all the components within the information handling system, the average power requirements for the components, other infrastructure requirements, user policies, or the like.

At block 208, the minimum number of power supply units, MIN_PSU_COUNT, is stored in a monitoring circuitry of a chassis management controller. A chassis armed signal, CHASSIS_ARMED signal, is sent to each server within the information handling system at block 210. In an embodiment, the chassis armed signal, CHASSIS_ARMED signal, is sent via a point-to-point communication over a low-latency interface, such as a serial link. At block 212, a determination is made whether a standby chassis management controller is present within the server.

If the standby chassis management controller is present, the minimum number of power supply units, MIN_PSU_COUNT, is synchronized between the primary chassis management controller and the standby chassis management controller. In an embodiment, this synchronization is performed by the primary chassis management controller storing the minimum number of power supply units, MIN_PSU_ COUNT, in monitoring circuitry of the standby chassis management controller. Otherwise, if the standby chassis management controller is not present, the flow continues as stated above at block 202.

If, at block 204, a persistent memory equipped server is not located within the information handling system, a value of zero is stored for the minimum number of power supply units, MIN_PSU_COUNT, at block 216. At block 218, a chassis disarmed signal, CHASSIS_DISARMED signal, is sent to each server within the information handling system, and the flow continues as described above at block 212.

Figure 3:
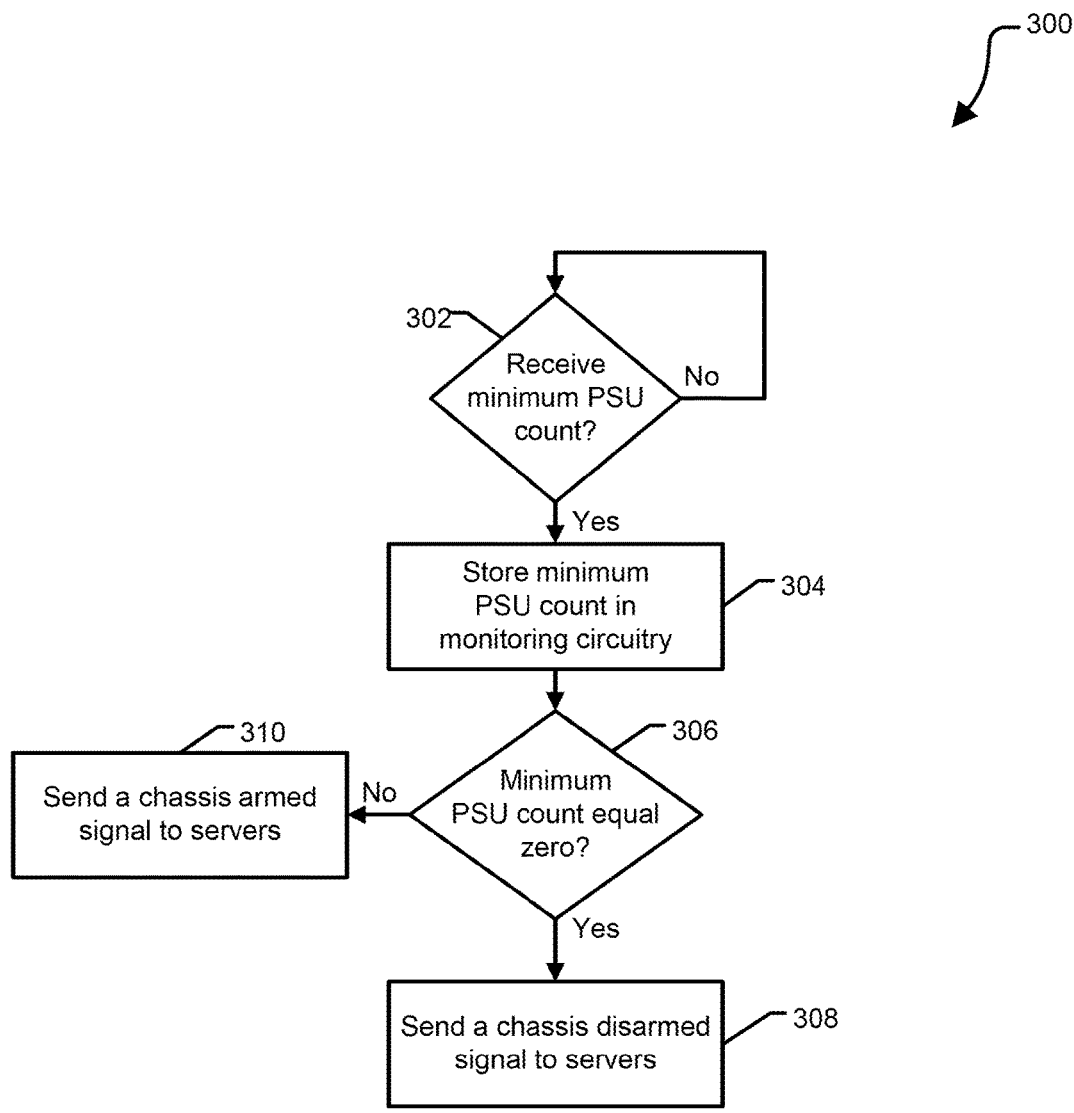
FIG. 3 is a flow diagram of another method for determining, in a standby management controller, whether the information handling system is armed or disarmed to monitor a power loss in the information handling system according to at least one embodiment of the present disclosure.

FIG. 3 illustrates a method 300 of a standby chassis management controller determining whether the information handling system or chassis is armed or disarmed to monitor a power loss in the information handling system according to at least one embodiment of the present disclosure. At block 302, a determination is made whether a minimum number of power supply units, MIN_PSU_COUNT, has been received. When the minimum number of power supply units, MIN_PSU_COUNT, is received, the minimum number of power supply units, MIN_PSU_COUNT, is stored in monitoring circuitry of the standby chassis management controller at block 304.

At block 306, a determination is made whether the minimum number of power supply units, MIN_PSU_COUNT, is zero. If the minimum number of power supply units, MIN_PSU_COUNT, is zero, a chassis disarmed signal, CHASSIS_DISARMED signal, is sent to each server within the information handling system at block 308. If the minimum number of power supply units, MIN_PSU_COUNT, is not zero, a chassis armed signal, CHASSIS_ARMED signal, is sent to each server within the information handling system at block 310.

Figure 4:
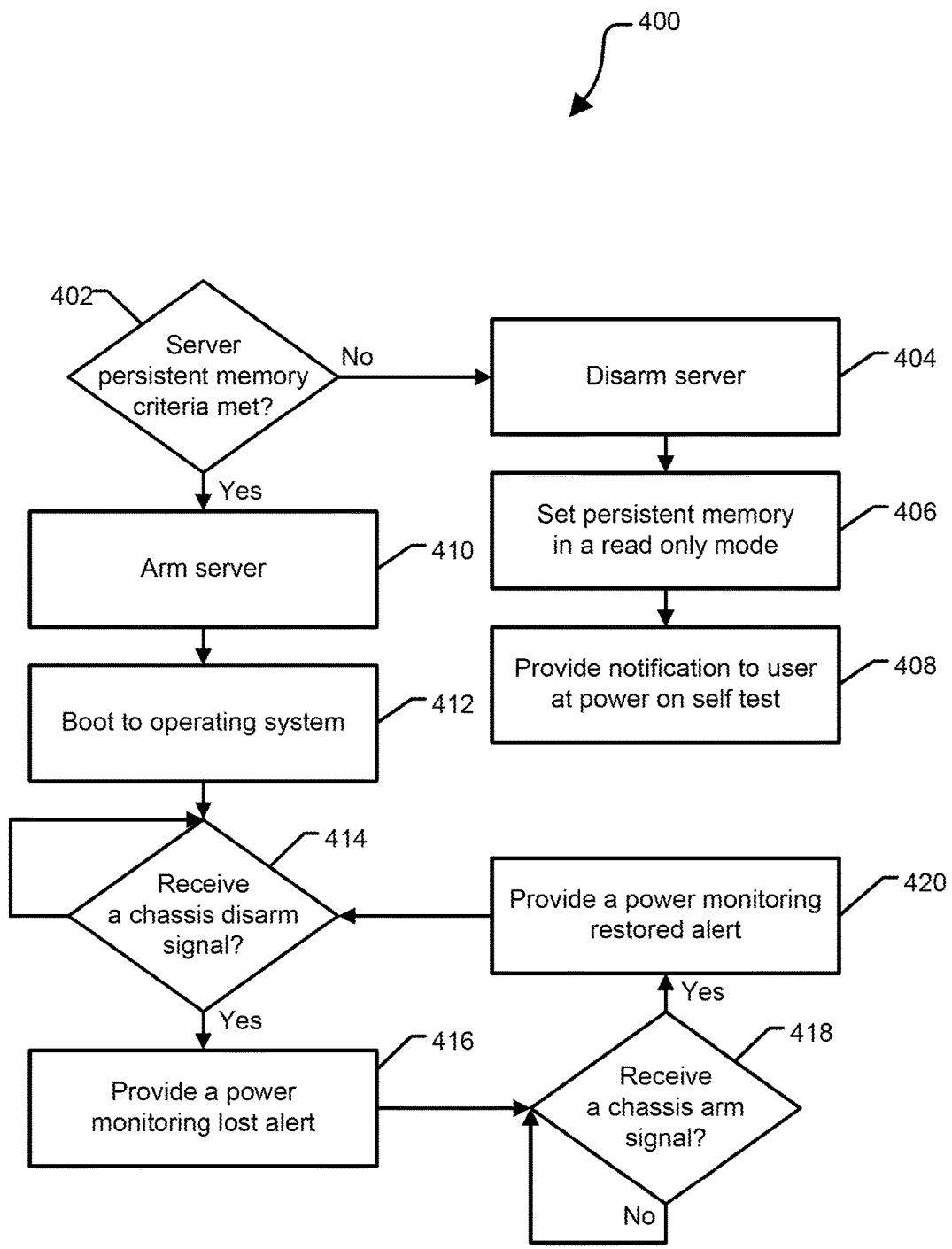
FIG. 4 is a flow diagram of a method for controlling a mode of operation for a persistent memory within a server of the information handling system according to at least one embodiment of the present disclosure.

FIG. 4 illustrates a method 400 for controlling a mode of operation for a persistent memory within a server of the information handling system according to at least one embodiment of the present disclosure. At block 402, a determination is made whether a server persistent memory criteria has been met. In an embodiment, the server persistent memory criteria can include that a chassis armed signal, CHASSIS_ARMED signal, has been received from either a primary chassis management controller or a standby chassis management controller. In different embodiments, the number of chassis management controllers can vary and the server persistent memory criteria can be that the chassis armed signal, CHASSIS_ARMED signal, has been received from multiple chassis management controllers, from all chassis management controllers, or the like.

If the server persistent memory criteria have not been met, the server is disarmed at block 404. At block 406, a persistent memory of the server is set in a read only mode. A notification is provided to a user during a power-on self test of the server at block 408. In an embodiment, the notification can indicate that the persistent memory is being operated in a read only mode. If, at block 402, the server persistent memory criteria have been met, the server is armed at block 410.

At block 412, the server is booted to an operating system. At block 414, a determination is made whether a chassis disarmed signal, CHASSIS_DISARMED signal, has been received. When a chassis disarmed signal, CHASSIS_DISARMED signal, has been received, a power monitoring lost alert is provided to a user of the server at block 416. At block 418, a determination is made whether a chassis armed signal, CHASSIS_ARMED signal, has been received. When a chassis armed signal, CHASSIS_ARMED signal, has been received, a power monitoring restored alert is provided to a user of the server at block 420, and the flow continues as stated above at block 414.

Figure 5:
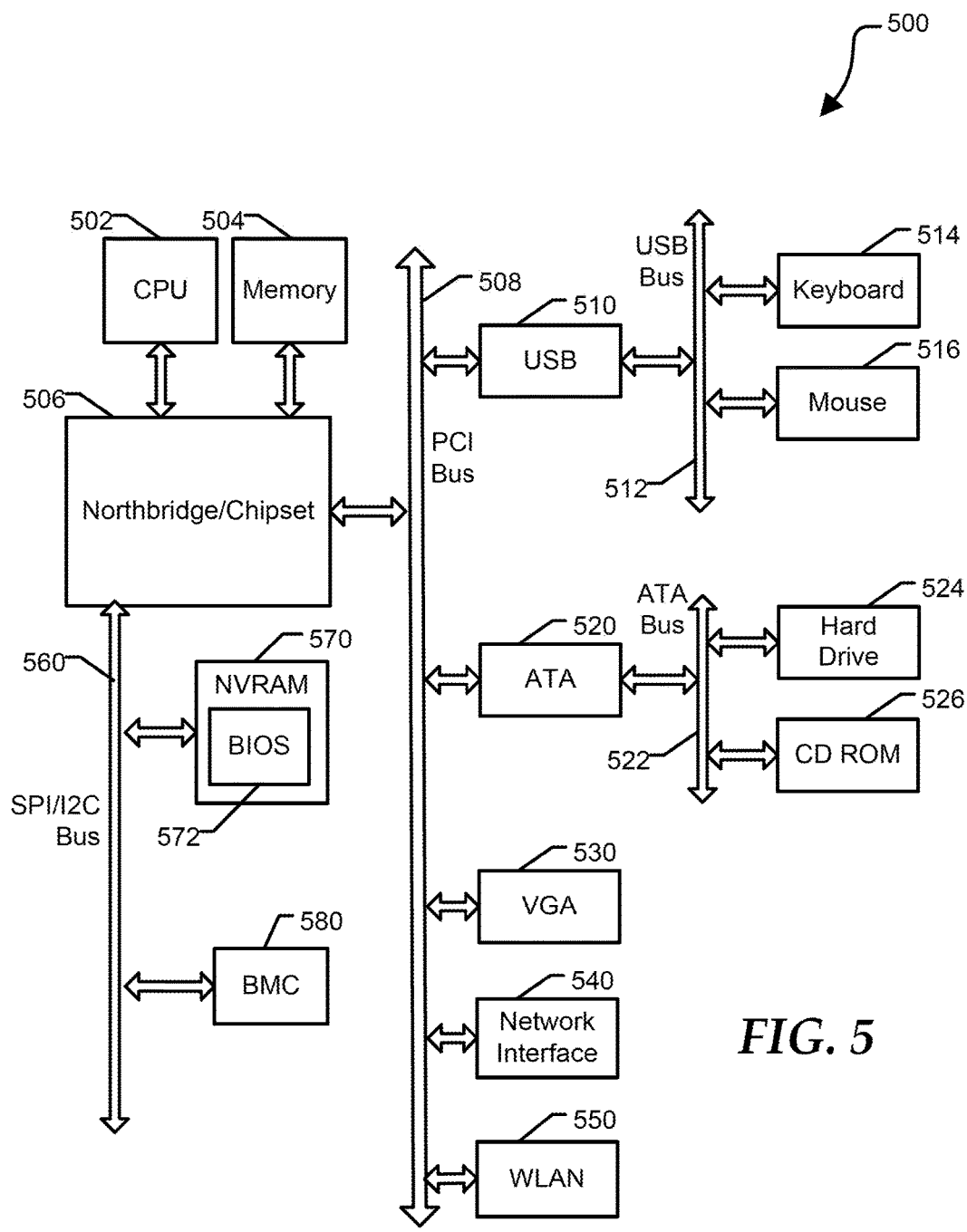
FIG. 5 is a block diagram of a general compute node within the information handling system according to an embodiment of the present disclosure.

FIG. 5 illustrates a general compute node 500 including a processor 502, a memory 504, a northbridge/chipset 506, a PCI bus 508, a universal serial bus (USB) controller 510, a USB 512, a keyboard device controller 514, a mouse device controller 516, a configuration an ATA bus controller 520, an ATA bus 522, a hard drive device controller 524, a compact disk read only memory (CD ROM) device controller 526, a video graphics array (VGA) device controller 530, a network interface controller (MC) 540, a wireless local area network (WLAN) controller 550, a serial peripheral interface (SPI) bus 560, a NVRAM 570 for storing BIOS 572, and a baseboard management controller (BMC) 580. BMC 580 can be referred to as a service processor or embedded controller (EC). Capabilities and functions provided by BMC 580 can vary considerably based on the type of compute node. For example, the term baseboard management system is often used to describe an embedded processor included at a server, while an embedded controller is more likely to be found in a consumer-level device. As disclosed herein, BMC 580 represents a processing device different from CPU 502, which provides various management functions for compute node 500. For example, an embedded controller may be responsible for power management, cooling management, and the like. An embedded controller included at a data storage system can be referred to as a storage enclosure processor.

Further, compute node 500 can include processing resources for executing machine-executable code, such as CPU 502, a programmable logic array (PLA), an embedded device such as a System-on-a-Chip (SoC), or other control logic hardware. Compute node 500 can also include one or more computer-readable medium for storing machine-executable code, such as software or data.

Compute node 500 can include additional processors that are configured to provide localized or specific control functions, such as a battery management controller. Bus 560 can include one or more busses, including a SPI bus, an I2C bus, a system management bus (SMBUS), a power management bus (PMBUS), and the like. BMC 580 can be configured to provide out-of-band access to devices at compute node 500. As used herein, out-of-band access herein refers to operations performed prior to execution of BIOS 572 by processor 502 to initialize operation of compute node 500.

BIOS 572 can be referred to as a firmware image, and the term BIOS is herein used interchangeably with the term firmware image, or simply firmware. BIOS 572 includes instructions executable by CPU 502 to initialize and test the hardware components of compute node 500, and to load a boot loader or an operating system (OS) from a mass storage device. BIOS 572 additionally provides an abstraction layer for the hardware, such as a consistent way for application programs and operating systems to interact with the keyboard, display, and other input/output devices. When power is first applied to compute node 500, the compute node begins a sequence of initialization procedures. During the initialization sequence, also referred to as a boot sequence, components of compute node 500 are configured and enabled for operation, and device drivers can be installed. Device drivers provide an interface through which other components of the compute node 500 can communicate with a corresponding device.

Compute node 500 can include additional components and additional busses, not shown for clarity. For example, compute node 500 can include multiple processor cores, audio devices, and the like. While a particular arrangement of bus technologies and interconnections is illustrated for the purpose of example, one of skill will appreciate that the techniques disclosed herein are applicable to other system architectures. Compute node 500 can include multiple CPUs and redundant bus controllers. One or more components can be integrated together. For example, portions of northbridge/chipset 506 can be integrated within CPU 502. Additional components of compute node 500 can include one or more storage devices that can store machine-executable code, one or more communications ports for communicating with external devices, and various input and output (I/O) devices, such as a keyboard, a mouse, and a video display. An example of compute node 500 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

Compute node 500 can include a set of instructions that can be executed to cause the compute node to perform any one or more of the methods or computer based functions disclosed herein. The compute node 500 may operate as a standalone device or may be connected to other computer systems or peripheral devices, such as by a network.

In a networked deployment, the compute node 500 may operate in the capacity of a server or as a client user computer in a server-client user network environment, or as a peer computer system in a peer-to-peer (or distributed) network environment. The compute node 500 can also be implemented as or incorporated into various devices, such as a personal computer (PC), a web appliance, a network router, switch or bridge, or any other machine capable of executing a set of instructions (sequential or otherwise) that specify actions to be taken by that machine. In a particular embodiment, the compute node 500 can be implemented using electronic devices that provide voice, video or data communication. Further, while a single compute node 500 is illustrated, the term "system" shall also be taken to include any collection of systems or sub-systems that individually or jointly execute a set, or multiple sets, of instructions to perform one or more computer functions.

The compute node 500 can include a disk drive unit and may include a computer-readable medium, not shown in FIG. 5, in which one or more sets of instructions, such as software, can be embedded. Further, the instructions may embody one or more of the methods or logic as described herein. In a particular embodiment, the instructions may reside completely, or at least partially, within system memory 504 or another memory included at compute node 500, and/or within the processor 502 during execution by the compute node 500. The system memory 504 and the processor 502 also may include computer-readable media.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of a compute node device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
   a plurality of power supply units to provide power to components within the information handling system, wherein the components include a plurality of servers within the information handling system;
   a first chassis management controller to communicate with the power supply units and with the servers, the first chassis management controller to calculate a first number of power supply units needed to provide power to the components of the information handling system, to store the first number of power supply units in first monitor circuitry of the first chassis management controller, and to assert a first chassis armed signal to the servers in response to a detection that the first number of power supply units is greater than zero; and
   a second chassis management controller to communicate with the power supply units, with the first chassis management controller, and with the servers, the second chassis management controller to receive the first number of power supply units from the first chassis management controller, to store the first number of power supply units in second monitor circuitry of the second chassis management controller, and to assert a second chassis armed signal to the servers in response to a detection that the first number of power supply units is greater than zero, wherein the servers operate in a persistent memory mode in response to reception of at least one of the first and second chassis armed signals.

2. The information handling system of claim 1, the first chassis management controller to determine if the first number of power supply units is zero, and to provide a first chassis disarmed signal in response to the first number of power supply units being zero.

3. The information handling system of claim 1, wherein the a first number of power supply units needed to provide power to the components of the information handling system is a minimum number of power supply units needed.

4. The information handling system of claim 3, the servers to disarm persistent memory within the servers and to place the persistent memory in a read only mode in response to reception of both the first and second chassis disarmed signals.

5. The information handling system of claim 1, wherein the first number of power supply units is determined based on configurations of the information handling system.

6. The information handling system of claim 1, wherein the first chassis armed signal is sent via a low-latency communication link.

7. The information handling system of claim 1, wherein the first chassis armed signal indicates that the current number of power supplies operating is being monitored by the first monitoring circuitry.

8. A method comprising:
  determining, by a first chassis management controller, whether a persistent memory equipped server is powered on in an information handling system;
  calculating a minimum number of power supply units to power components of the information handling system;
  storing, in first monitor circuitry of the first chassis management controller, the minimum number of power supply units;
  providing the minimum number of power supply units to a second chassis management controller;
  storing, in second monitor circuitry of the second chassis management controller, the minimum number of power supply units;
  broadcasting, by the first monitor circuitry, a first chassis armed signal;
  broadcasting, by the second monitor circuitry, a second chassis armed signal; and
  entering, by the persistent memory equipped server, into a persistent memory mode in response to receiving at least one of the first and second chassis armed signals at the persistent memory equipped server.

9. The method of claim 8, further comprising:
  monitoring, by the first chassis management controller, the power supply units;
  determining whether the current number of active power supply units;
  determining if the minimum number of power supply units is zero; and
  providing a first chassis disarmed signal in response to the minimum number of power supply units being zero.

10. The method of claim 9, further comprising:
  monitoring, by the second chassis management controller, the power supply units;
  determining whether the current number of active power supply units;
  determining if the minimum number of power supply units is zero; and
  providing a second chassis disarmed signal in response to the minimum number of power supply units being zero.

11. The method of claim 10, further comprising:
  disarming persistent memory within the servers in response to reception of both the first and second chassis disarmed signals; and
  placing the persistent memory in a read only mode in response to reception of both the first and second chassis disarmed signals.

12. The method of claim 11, wherein the first number of power supply units is determined based on configurations of the information handling system.

13. The method of claim 8, wherein the first chassis armed signal is sent via a low-latency communication link.

14. The method of claim 8, wherein the first chassis armed signal indicates that the current number of power supplies operating is being monitored by the first monitoring circuitry.

* * * * *